United States Patent [19]

Mallavarpu

[11] Patent Number: 4,897,609
[45] Date of Patent: Jan. 30, 1990

[54] AXIALLY COUPLED GYROTRON AND GYRO TWTA

[75] Inventor: Raghuveer Mallavarpu, Acton, Mass.

[73] Assignee: Raytheon Company, Lexington, Mass.

[21] Appl. No.: 138,740

[22] Filed: Dec. 28, 1987

[51] Int. Cl.[4] .......................... H03F 3/58; H01J 25/00
[52] U.S. Cl. .......................................... 330/43; 315/4
[58] Field of Search .......................... 330/43; 315/4, 5

[56] References Cited

U.S. PATENT DOCUMENTS 4,395,655  7/1983  Wurthman ............................. 315/5
4,482,843  11/1984  Perring ................................. 315/5

*Primary Examiner*—Gene Wan
*Attorney, Agent, or Firm*—Richard M. Sharkansky

[57] ABSTRACT

A tilt-angle gun provides a conically-shaped electron beam formed in a magnetically-shielded region which is injected into a coaxial waveguide of the amplifier embodiment of the invention and into a coaxial cavity of the oscillator embodiment immersed in the main magnetic focussing system to form a hollow gyro beam of large radius. RF power input and the amplified rf power output are simply and easily provided through circular input and output waveguides coupled respectively to each end of the coaxial waveguide by slotted sections. The electron beam and the output rf energy are naturally physically separated so that extraction of the rf output is facilitated and occurs with little rf power loss.

18 Claims, 3 Drawing Sheets

AXIALLY COUPLED GYROTRON AND GYRO TWTA

BACKGROUND OF THE INVENTION

This invention relates to gyrotrons and more particularly to a high power high frequency gyrotron and gyro beam traveling wave tube amplifier (TWTA).

Prior art gyrotrons and amplifiers of the type which use a magnetron injection gun to provide a beam in which the electrons orbit about an axis which is the central axis of the gyrotron tube are limited in power handling capability and frequency at which they operate.

Prior art gyrotrons and amplifiers used an axial gyro beam to interact with a $TE_{ml}$ mode rf wave in a circular interaction cavity. The gyro electron beam was injected axially from an axially located electron beam source. The rf signal was provided to the interior of the circular interaction cavity by a circular waveguide and its rectangular-to-circular transition section which were located between the outer conductor of the cavity and the focussing magnet. A rectangular input waveguide was used to provide the rf signal to the transition section. The manner for injecting the input signal into the interior of the circular cavity is cumbersome and physical constraints make assembly of a prior art gyrotron more difficult. The amplified rf energy from the output of the circular interaction cavity must be separated from the axial gyrobeam. The techniques available resulted in substantial RF energy being transmitted along with the electron beam to a collector resulting in lower efficiency for the gyrotron. In a prior art attempt to attain the rf separation, a so-called miter-bend structure generated unwanted modes which tended to limit the practicability of the approach.

Proposed megawatt CW gyrotron designs at 100 GHz have considered several approaches which include the quasi-optical cavity, the higher order symmetrical circular waveguide mode ($TE_{0n}$) interaction, the $TE_{ml}$ mode interaction, and multicavity interaction. Among these designs, the last approach may be adequate for achieving the megawatt goal at 100 GHz because difficulties with mode competition, ohmic heating and beam formation probably can be rendered tractable. Although remarkable progress has been demonstrated recently in achieving hundreds of kW CW power in the 60–100 GHz range, frequency and power extension of these gyrotron designs to meet the indicated goal seems nonetheless ambitious for reasons known to those skilled in the art.

It is therefore an object of this invention to provide an amplifier or an oscillator configuration of a gyrotron interaction device which is capable of providing higher power output and at a higher frequency than has been hitherto available by using the mode selectivity of the multi-stage cavity approach of this invention.

SUMMARY OF THE INVENTION

A tilt-angle gun provides a conically-shaped electron beam formed in a magnetically-shielded region which is injected into a coaxial waveguide of the amplifier embodiment of the invention and into a coaxial cavity of the oscillator embodiment immersed in the main magnetic focussing system to form a hollow gyro beam of large radius. RF power input and the amplified rf power output are simply and easily provided through circular input and output waveguides coupled respectively to each end of the coaxial waveguide by slotted sections. The electron beam and the output rf energy are naturally physically separated so that extraction of the rf output is facilitated and occurs with little rf power loss.

The advantages of this hollow gyro beam formation technique include low current density loading of the emitter, low electron velocity spread in the beam, space-charge-limited operation of the electron beam from the source, low noise, and high electron beam power at large beam radius. The coaxial waveguide or cavity is accessible for cooling through the center region of the tilt-angle gun assembly. The coaxial waveguide or cavity provides a substantial increase in the gyrobeam guiding center radius which provides high power capability at high frequencies because of the large radius and higher efficiency because degradation from electron beam space charge and velocity spread effects are reduced. The use of coaxial/circular $TE_{0n}$ modes in a tandem, multicavity configuration improves mode selectivity which might otherwise be a problem in view of the increase mode competition associated with high current operation in the gyrotron tube of this invention.

A feature of the coaxial waveguide or cavity construction of the tube of this invention is that it provides a structure for decoupling the amplified rf wave from the beam collector structure. This is accomplished by means of a coaxial waveguide to a circular waveguide matched transition for the rf energy. Mode-selective coupling to the rf output of the tube is provided by choosing the waveguide impedance of the desired output mode to be near that of the coaxial waveguide mode.

BRIEF DESCRIPTION OF THE DRAWINGS

The aforementioned aspects and other features of the invention will be apparent from the following description taken in conjunction with the accompanying drawings wherein.

DESCRIPTION OF THE PREFERRED EMBODIMENT

Figure 1:
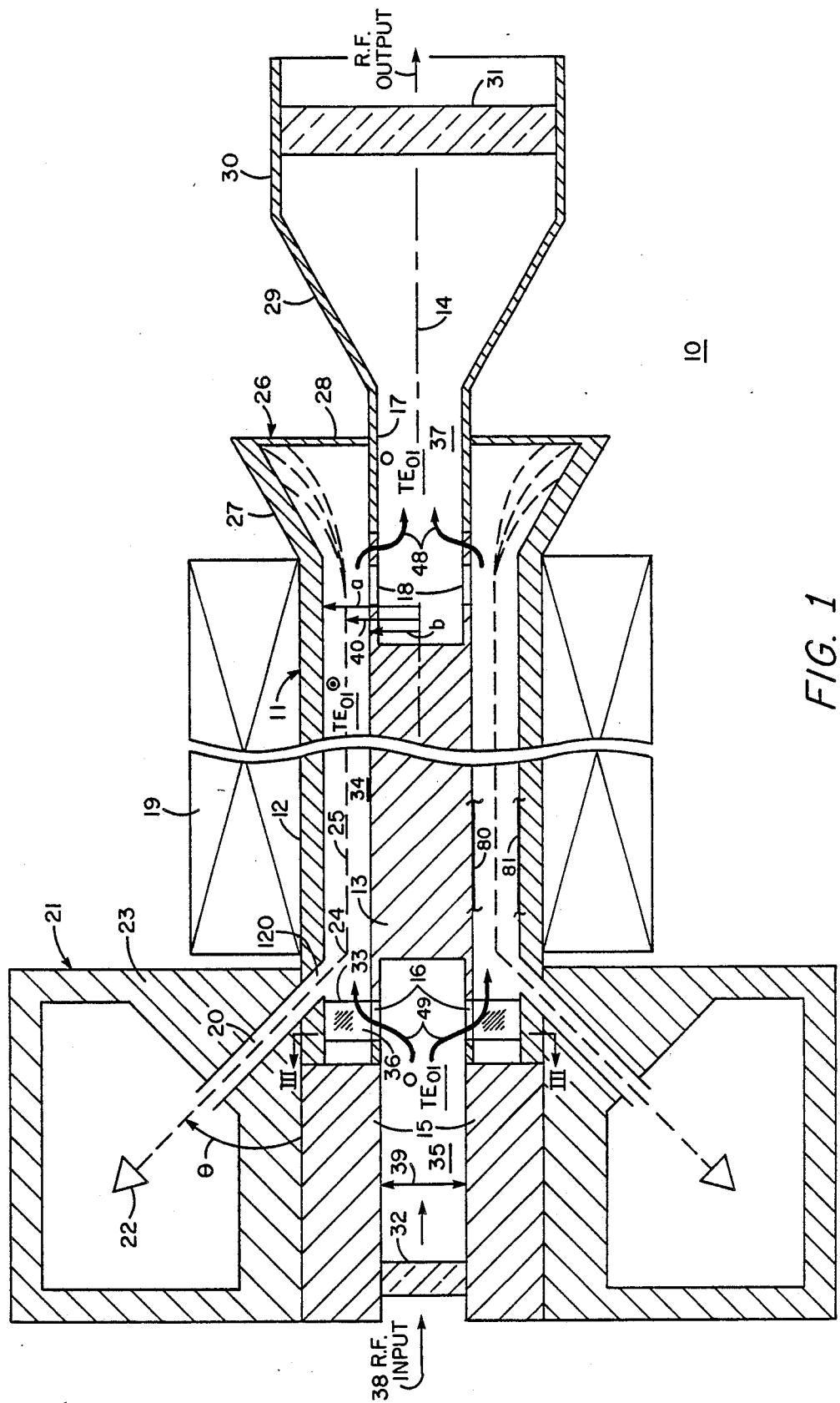
FIG. 1 is a cross-sectional view taken along the axis of symmetry of the amplifier tube of this invention.

Referring to FIG. 1, there is shown a preferred embodiment of the axially coupled gyro-TWT tube of this invention. Tube 10 comprises a coaxial section 11 comprising an outer metallic cylinder 12 and an inner metallic cylinder 13 both of which are concentric with the cylindrical axis 14 about which the tube 10 is circularly symmetric. FIG. 1 is a cross-sectional view of the tube 10 taken through the longitudinal axis 14. The coaxial section 11 is coupled to an input waveguide 15 at one end by slots 16 and is coupled to the output circular waveguide 17 at its output end by slots 18 in the wall of the waveguides 16, 17, respectively. A superconducting magnet 19 surrounds the coaxial waveguide 11. An electron beam 20 is injected through a slot 120 in the wall 12 of coaxial waveguide 11 from a tilt-angle gun 21 having an emitter 22 and associated focussing and accelerating electrodes (not shown). A magnetic shield 23 surrounds the electron emitter 22 and its associated electrodes. The tilt-angle gun provides electron beam 20 which is substantially mono-energetic into the coaxial waveguide 11 where interaction with the magnetic field produced by magnet 19 causes the beam at position 24 to be a relativistic gyro beam having a longitudinal and a tangential component centered on the cylindrical beam of electrons 25. A more detailed description of the tilt-angle gun 21 may be found in U.S. Pat. No. 4,562,380 incorporated herein by reference. After passing through the coaxial waveguide 11, the electrons in the cylinder of electrons 25 impinge upon the collector region 26 which is formed of an outwardly diverging wall 27 and an end wall 28 upon both of which the electrons impinge. The coaxial waveguide 17 diverges outwardly at section 29 to form a larger diameter waveguide 30 in which an output waveguide window 31 forms a vacuum-tight seal. An rf window 32 at the input of waveguide 15 also provides a vacuum-tight seal so that the tube 10 may be evacuated using standard techniques.

Figure 3:
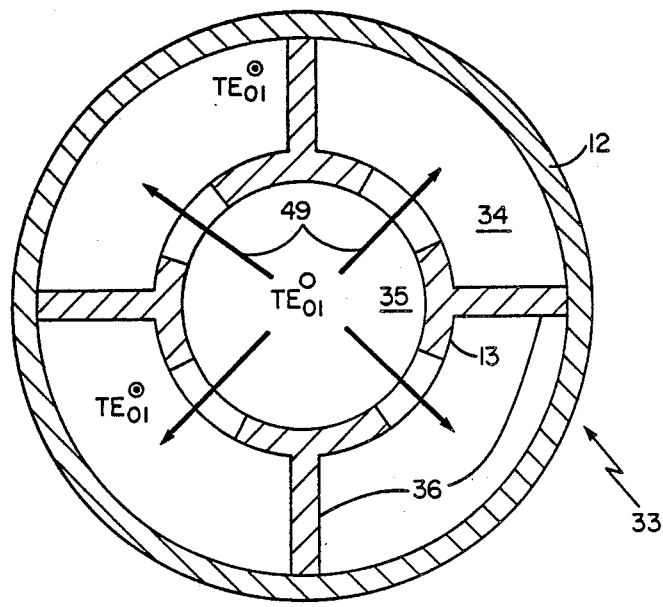
FIG. 3 is a cross-sectional view taken at section line III—III of FIG. 1 of the mode filter.

A mode filter 33 may be incorporated with the input coupler 16 as shown in FIG. 1 and with the output coupler 18 (filter not shown) so that higher order coaxial modes may not be excited in the interaction region 34 of the coaxial waveguide 12. The filter 33 may be in the form of a "spoked wheel" as shown in FIG. 3 where only four slots 16 although in an actual embodiment a greater even number of slots may be desirable in order to couple the energy from the interior 35 of waveguide 15 to the region 34 of coax waveguide 12. The spokes 36 prevent modes other than the $TE_{0n}$ modes from propagating in the interaction region 34. The modes shown in FIG. 1 are waveguide modes $TE_{01}$ within waveguides 15, 17 and a coaxial $TE_{01}$ mode within the interaction cavity 34 of coaxial waveguide 11 with power flow shown by direction arrows 48, 49.

Additional spurious mode damping may be achieved by lining the inside of the outer coaxial conductor with an rf lossy material 81.

Figure 2:
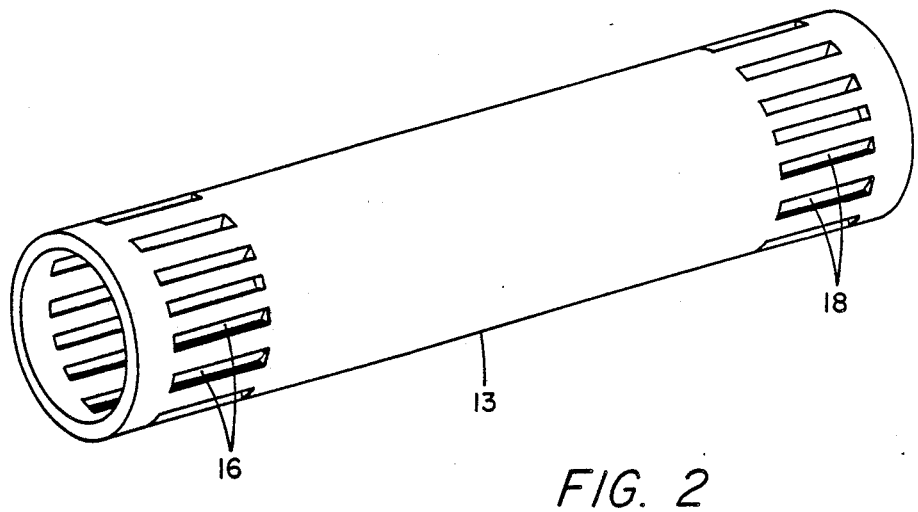
FIG. 2 is an isometric view of the center conductor of the coaxial waveguide of FIG. 1.

FIG. 2 shows an isometric view of the inner conductor 13 of coaxial waveguide 11. FIG. 2 shows many more coupling slots 16, 18 than are shown in FIG. 3 to illustrate a construction which may be required in order to produce optimum coupling between the interaction region and the input and output regions 35, 37, respectively. The spokes 36 are shown in FIG. 1 in plan view, assuming that the plane of the pair of spokes 36 are slightly rotated with respect to the plane of the paper of FIG. 1.

In some applications where increased amplifier bandwidth is desired, the amplifier of FIG. 1 may be operated as a slow-wave amplifier by coating the outside of the inner conductor 13 with a dielectric material 80.

In operation, an electron beam 20 is injected at an angle into the interaction region 34 of coaxial waveguide 11 by the tilt-angle gun whose emitter 22 is maintained at a high negative potential of 80 kilovolts where it interacts with the magnetic field produced by a superconducting solenoid whose shape magnetic focussing field has an intermediate level, approximately 10 kG. Subsequent magnetic compression by an increasing focussing field produces the final transverse-to-parallel velocity ratio which orbit about as they travel longitudinally down the axial length of the tube 10. The cylindrical beam of electrons 25 is established at a radius with respect to the longitudinal axis 14 which is coincident with an antinode of a $TE_{01}$ coaxial mode which exists in the interaction region 34. The rf input signal to be amplified in tube 10 is provided to the interior of region 35 of circular waveguide 15 through window 32. The diameter of region 35 and the frequency of the rf input signal 38 determine the order n of the $TE_{0n}$ mode which is established in the interior 35 of waveguide 15. Since the rf signal power at the input to the amplifier 10 is small, the diameter 39 may be small and it will be assumed that a $TE_{01}$ mode is established in region 35. This energy is transmitted through slots 16 into the interaction region 34 after preferably passing through mode filter 33 to thereby establish in interaction region 34 a $TE_{0n}$ coaxial mode. The order n will be determined by the frequency of the rf signal and the radii a and b of the inner and outer conductors 12, 13, respectively, of the coaxial waveguide 11. For lower power situations, the $TE_{01}$ mode with an antinode will occur midway between the radii a and b and the diameter of the cylindrical electron beam 25 should approximately coincide with the antinode of the $TE_{01}$ mode.

The tube of this invention has high beam coupling impedance and higher power capability than previously attainable with conventional gyrotrons in the millimeter and sub-millimeter regions of operation. The frequency of operation of the tube is determined by the coaxial gap, i.e., for the $TE_{0n}$ coaxial mode in the coaxial waveguide 11. The cut-off frequency $f_c$ is given by $Cn/2(a-b)$, $n = 1,2,3...$, where C=velocity of light and a,b are the coaxial wavelength radii. The significance of this equation is that for a given $TE_{0n}$ mode of operation with high power requirements at a frequency f in the millimeter or sub-millimeter range, the radii a and b are increased while keeping their difference $(a-b)$ constant so that a high current beam with a larger guiding center radius 40 resulting in lower current density loading of the emitter 22 is obtained.

In addition to increasing the size of the coaxial waveguide, introduction of the electron beam 20 at the higher order antinodes permitted by the coaxial/circular waveguide construction of the tube of this invention alleviates the current limitations associated with gyrobeams space-charge potential depression. The formation of the gyro electron beam 24 also becomes more tractable at a larger guiding-center radius, especially at high frequencies (150 GHz). Thus, beam interaction at larger values of beam radius 40 has advantages which are accompanied by increased mode densities which are associated with an overmoded waveguide, particularly the asymmetric modes.

A feature of the tube of this invention is a simple input/output coupling mechanism that is employed which is made feasible by utilization of the tilt-angle gun. The coupling is achieved by the axial slots 16, 18 which couple the axially located waveguides 15, 17 to the coaxial waveguide 11 containing the interaction region 34. The slots 16 are such as to convert the input circular $TE_{01}$ mode to a coaxial $TE_{01}$ mode. At the output, the slots 18 convert the coaxial $TE_{01}$ mode into a circular $TE_{01}$ mode. If, as stated previously, high power requirements are imposed, then the coaxial $TE_{01}$ may instead be converted to a $TE_{02}$ or a $TE_{03}$ mode with corresponding increase in the difference of the radii (a−b) and an increase in the gyrobeam radius 40.

Figure 4:
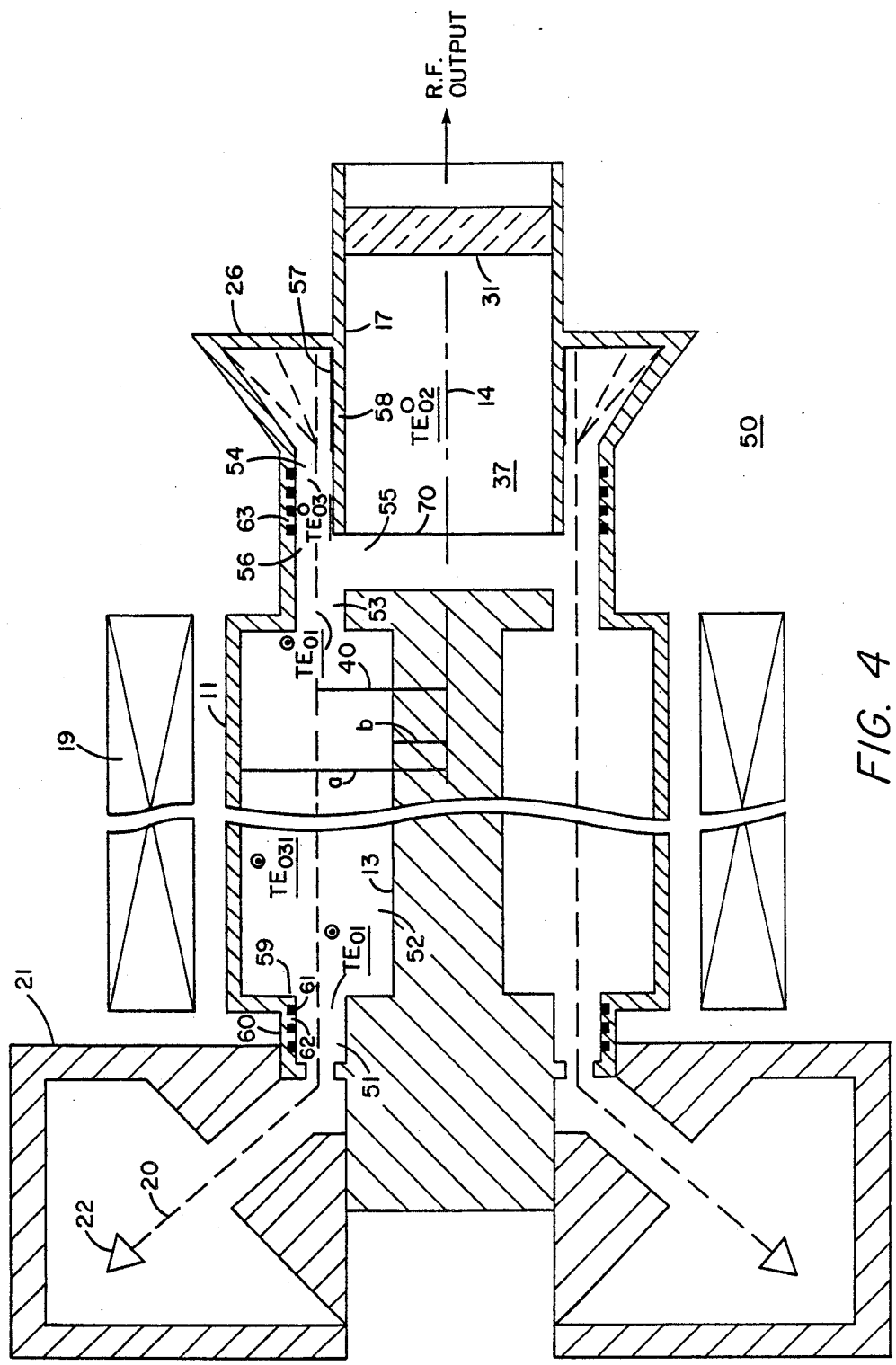
FIG. 4 is a cross-sectional view taken along the axis of symmetry of an oscillator embodiment of this invention.

FIG. 4 shows an oscillator embodiment of this invention which is shown as an axially symmetric tube with components in common with that of FIG. 1 being numbered with corresponding numbers. The oscillator 50 of FIG. 4 comprises a buncher cavity 51 which achieves a favorably-disposed phase modulation of the gyrobeam 24 at relatively low fields within the cavity 51 which are resonantly coupled to the main cavity 52 field. In addition to enhanced mode selectivity, an important result of the interaction of the fields in cavities 51, 52 is the achievement of increased electronic conversion efficiency at rf field levels well below those required for a single stage cavity. Thus, what is obtained is a multi-stage cavity operating in the circular-symmetric mode, in which the buncher cavity 51 supports a coaxial mode coupled selectively to the main cavity 52. Enhanced mode selectivity (increased start oscillation beam 20 current levels in the undesired modes) is a direct benefit of the junction between the dissimilar waveguide sections of cavities 51, 52. Since operation with the gyrobeam radius 40 of the largest practical size, the complex coaxial cavities 51, 52 is shown employing the coaxial $TE_{031}$ mode with interaction occurring at the second antinode. Without the tandem $TE_{01}$ cavities 51, 53 attached, there could be mode competition from the $TE_{141}$ mode because the start oscillation current for the $TE_{141}$ mode is very close to that of the $TE_{031}$ mode. Proper selection of the inner to outer conductor radius ratio (b/a) is determined by consideration of the cut-off frequency modes for the $TE_{mn}$ coaxial guide modes. The TM modes are ignored since the interaction effects near the cut-off frequency is not significant. The $TE_{01}$ waveguide cavity 51 section is made coincident with the $TE_{031}$ second antinode of the cavity 52 to cause selective enhancement of the start oscillation current in the $TE_{031}$ mode relative to the $TE_{141}$ mode. The energy contained in the gyrobeam 24 is coupled from the cavity 52 through the coaxial section 53 whose output is coupled to waveguide 17 in a $TE_{02}$ mode and into the collector as a $TE_{03}$ mode along with the electron beam impinging on the collector 26.

Because of the desirability of operating at very high powers, it is desirable to separate the rf coupling from the beam collection at the output of the oscillator tube 50. The coaxial interaction leads to a natural method for coupling the rf power by means of an over-moded circular waveguide inside the beam collector 26. The output coupling from the cavity 52 is made through a properly dimensioned transition involving the coaxial $TE_{01}$ mode in cavity section 53 to the circular waveguide mode $TE_{03}$ in the waveguide 54 of the collector 26 section. The cavity 53 is also coupled through the circular opening 55 to the $TE_{02}$ circular waveguide output to the rf window 31. The dimensions of the collector coaxial port 56 is selected for low coupling to the collector 26. To compensate for any slight non-concentricities, it is possible to use a passive mode filter 33 such as that shown in FIG. 1 near the entrance to the cavity 52. A lossy graphite sleeve 57 might be used to align the surface of the inner collector sleeve 58 in order to prevent spurious rf being generated by the collector 26.

In summary, the choice of a multi-coaxial cavity embodiment over the prior art multi-circular cavity is not without certain detractions. Additional rf losses are incurred as a result of the decreased ohmic Q of the coaxial cavity. Also, the added difficulties in achieving concentricity may be an encumbrance. Increased mode density occurs with the coaxial cavity approach which is overcome by the mode selectivity of the tandem cavity configuration. Any detriment to the multicoaxial cavity configuration is believed to be out-weighed by the ability to utilize the unique potential advantages of the tilt-angle gun in the embodiments of the invention. One important feature of the coaxial cavity approach is the rf decoupling from the electron beam prior to collection. In the case of the present invention where a coaxial-to-circular guide transition occurs, the potential exists for achieving the coupling via the symmetrical circular waveguide modes after the manner of the Marcatili coupler as disclosed in the Bell System Technical Journal, January 1961. The second advantage of employing the multi-coaxial cavity is that the gyrobeam radius can be made arbitrarily large within reason. At high frequency and high average power, the resulting relief on beam size limitation permits the beam limiting current arising from space-charged potential depression to be greatly extended by virtue of the reduced charge density and of the increased beam radius relative to the outer guide wall 12. A significant benefit of the increased beam guide center radius 40 lies in the relief afforded to the beam formation system of the tilt-angle gun 21. Efficiency degradation is minimized because of the reduced velocity spreads which can be achieved at larger radius. Also, reduced beam voltage operation is expected for megawatt CW operation, i.e., 60 to 80 KV versus 80 to 100 KV for other configurations.

The tilt-angle gun 21 which is shown schematically in FIG. 1 and FIG. 4 injects a conical electron beam 20 into a shaped magnetic focussing field having an intermediate value of approximately 15 Kilogauss. Subsequent magnetic compression in the main focussing solenoid in the region 24 will achieve the final transverse-to-parallel velocity ratio, $\alpha$. Since magnetic material saturation limits the intermediate fields to the 15 to 20 kilogauss range, the injection angle, $\theta$ is kept in the 25 to 35 degree range to achieve a sufficiently low $\alpha$ value. For example, to achieve a final $\alpha$ value of 1.5 at 150 GHz, a 25 degree angle would be conservative. The tilt angle gun 21 provides suitable beam parameters for gyrotron interaction at 100 GHz at 2 MW of CW beam power loading at the emitter 22 of only a few ampere per square centimeter.

Mode conversion at the output transition region 55 is accomplished by matching the waveguide impedance of the interaction cavity or waveguide mode ($TE_{06}$, for example) to a circular symmetric mode ($TE_{02}$, for example) at the aperture 70 of the output waveguide 17. Choice of beam interaction at the high order field peaks introduces the added complication of increased mode competition with the asymmetric modes. To achieve rf beam separation with the embodiments of FIG. 1, 4 asymmetric modes must be prevented from being trapped since they couple poorly to circular output waveguide 17 having a radius much smaller than that of the main cavity 11. These difficulties with the asymmetric modes are mitigated by a concentric-ring mode filter 59 in the outer wall 60 of the buncher cavity 51. The ohmic q associated with asymmetric modes can be greatly reduced relative to symmetric modes with the inclusion of recessed lossy ceramics 61 between the conductive rings 62 of the filter 59. In operation, filter 59 causes an increase in the start oscillation current levels of the beam 24 for the asymmetric modes by decreasing the corresponding ohmic q values. A similar mode filter 63 is provided in the annular beam exit port 56, which is at cutoff frequency to the symmetric modes. Filter 63 inhibits interaction with any of the several propagating asymmetric modes in this "cut-off" region.

While the invention has been described in its preferred embodiments, it is to be understood that changes may be made within the purview of the appended claims without departing from the true scope and spirit of the invention in its broader aspects.

What is claimed is:

1. A gyro beam tube comprising:
said tube having a longitudinal axis of symmetry;
means for providing a hollow gyro electron beam concentric with said axis;
means for providing input rf energy along the axis of said tube;
means coupling said input rf energy to said beam; and
means coupling amplified rf energy out of said beam.

2. The tube of claim 1 wherein:
said means for providing a hollow gyro electron beam comprises an electron gun providing a conical electron beam into an end of a coaxial waveguide; and
magnetic means for converting said conical beam to a hollow gyro beam and for focussing said hollow gyro electron beam along the length of said coaxial waveguide.

3. The tube of claim 2 wherein said means coupling input rf energy further comprises:
a first axially concentric circular waveguide for providing input rf energy; and
a first aperture connecting said first circular waveguide to said coaxial waveguide to allow said input rf energy to pass from said first circuit waveguide to said coaxial waveguide.

4. The tube of claim 3 wherein said means coupling amplified rf energy out of said beam comprises:
a second axially concentric circular waveguide for providing output rf energy; and
a second aperture connected said second circular waveguide to said coaxial waveguide to allow said amplified rf energy to pass from said coaxial waveguide to said second circular waveguide.

5. The tube of claim 1 comprising in addition:
an interaction region between said means axially coupling rf energy into and said means coupling rf energy out of said hollow gyro electron beam.

6. The tube of claim 1 comprising in addition:
means for collecting said hollow gyro electron beam concentric with and radially displaced outwardly from said means axially coupling rf energy out of said beam.

7. The tube of claim 1 wherein:
said coaxial waveguide means has an inner concentric conductor on the axis of said coaxial waveguide; and
said inner concentric conductor being coated with a dielectric material.

8. The tube of claim 1 wherein said means coupling input rf energy to said beam comprises an interaction region of said input rf energy and said electron beam, said interaction region comprising an axially concentric coaxial waveguide.

9. A gyro traveling wave amplifier tube comprising:
a coaxial waveguide means;
means for providing a hollow gyro electron beam in said coaxial waveguide means;
a first axial circular waveguide means for coupling input rf energy to said coaxial waveguide means; and
a second axial circular waveguide means for coupling output rf energy from said coaxial waveguide means.

10. The amplifier tube of claim 9 comprising in addition:
means for providing an input signal to said amplifier tube at another end of said first circular waveguide means; and
means for providing an output signal from said amplifier tube at another end of said second circular waveguide means.

11. The amplifier tube of claim 9 comprising in addition:
a collector means for terminating said gyro electron beam; and
said collector means comprising a third circular waveguide means concentric with and surrounding said second axial circular waveguide means.

12. The amplifier tube of claim 9 wherein said means for providing a hollow gyro electron beam comprises:
a tilt-angle electron beam source providing a conical beam of electrons into a first end of said coaxial waveguide means;
a magnetic field means acting upon said conical electron beam to form said hollow gyro electron beam; and
said tilt-angle beam being concentric with and outside said first axial circular waveguide means.

13. The tube of claim 9 wherein:
said second axial circular waveguide means one end and said another end of said coaxial waveguide means have a common wall with slots in said common wall providing said coupling.

14. The tube of claim 9 wherein:
said first axial circular waveguide means one end and said one end of said coaxial waveguide means being coupled by slots in a wall common to said one ends.

15. The tube of claim 14 comprising in addition:
said coaxial waveguide having an inner and outer concentric wall;
said inner wall having said slots extending longitudinally and through said inner wall; and
longitudinally extending ribs attached to said inner wall between said slots and attached to said outer wall to form a mode filter.

16. A gyrotron oscillator tube comprising:
said tube having a longitudinal axis of symmetry;
a first coaxial cavity means;
means for providing a hollow gyro electron beam concentric with said axis in one end of said coaxial cavity means;
means for coupling rf energy out of a second end of said coaxial cavity means comprising a concentric cylindrical waveguide; and
an aperture connecting said second end and said cylindrical waveguide to allow rf energy to pass from said coaxial cavity means to said cylindrical waveguide.

17. The tube of claim 16 wherein:
said means for providing a hollow gyro electron beam comprises an electron gun providing a conical electron beam into one end of said first coaxial cavity; and
magnetic means for converting said conical beam in said one end to a hollow gyro electron beam and for focussing said hollow gyro electron beam along the length of said first coaxial cavity.

18. The tube of claim 17 wherein said first coaxial cavity comprises a buncher coaxial cavity, an interaction coaxial cavity, and an output coaxial cavity;

said buncher coaxial cavity being the region of said first cavity where the hollow gyro electron beam is formed;

said interaction coaxial cavity connected concentrically with said buncher cavity being the region where the hollow gyro electron beam gives up energy to an rf frequency field resonant within said interaction cavity;

an impedance matching coaxial cavity concentrically connected to said interaction cavity;

a collector waveguide having a cut-off frequency below that of the resonant frequency;

an output circular waveguide concentric with and within said collector waveguide connected to said impedance matching cavity; and whereby said gyro electron beam enters said collector waveguide and said resonant frequency enters said output waveguide.

* * * * *